(12) United States Patent
Lin et al.

(10) Patent No.: US 7,544,561 B2
(45) Date of Patent: Jun. 9, 2009

(54) ELECTRON MOBILITY ENHANCEMENT FOR MOS DEVICES WITH NITRIDED POLYSILICON RE-OXIDATION

(75) Inventors: Wenli Lin, Hsinchu (TW); Da-Yuan Lee, Kaohsiung (TW); Chi-Chun Chen, Kaohsiung (TW); Shih-Chang Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 146 days.

(21) Appl. No.: 11/593,293

(22) Filed: Nov. 6, 2006

(65) Prior Publication Data

US 2008/0124861 A1    May 29, 2008

(51) Int. Cl.
*H01L 21/8238* (2006.01)
(52) U.S. Cl. .............................. 438/232; 257/E21.632
(58) Field of Classification Search ................. 438/232; 257/E21.632
See application file for complete search history.

(56) References Cited

U.S. PATENT DOCUMENTS

| 5,648,284 | A * | 7/1997 | Kusunoki et al. ........... 438/286 |
| 6,780,776 | B1 | 8/2004 | Qi et al. |
| 7,071,067 | B1 * | 7/2006 | Ahmad ....................... 438/302 |
| 2005/0164444 | A1 * | 7/2005 | Burnham et al. ............ 438/232 |
| 2006/0154425 | A1 | 7/2006 | Yang et al. |

FOREIGN PATENT DOCUMENTS

| CN | 1501470 | 6/2004 |
| CN | 1815703 | 8/2006 |

OTHER PUBLICATIONS

Authors: Paul G. Y. Tsui, Hsing-Huang Tseng, Marius Orlowski, Shih-Wei Sun, P. J. Tobin, Kimberly Reid, and William J. Taylor Title: Suppression of MOSFET Reverse Short Channel Effect N20 Gate Poly Reoxidation Process Publisher: IEDM Tech. Digest, pp. 501-504 (1994).*
S. Kusunoki, M. Inuishi, T. Yamaguchi, K. Tsukamoto, and Y. Akasaka "Hot-carrier-resistant structure by re-oxidized nitrided oxide sidewall for highly reliable and high performance LDD MOSFETS" IEEE IEDM, Technical Digest, vol. 91, 1991, pp. 649-652.*

* cited by examiner

*Primary Examiner*—Matthew Smith
*Assistant Examiner*—Walter H Swanson
(74) *Attorney, Agent, or Firm*—Slater & Matsil, L.L.P.

(57) ABSTRACT

A semiconductor structure includes a PMOS device and an NMOS device. The PMOS device includes a first gate dielectric on a semiconductor substrate, a first gate electrode on the first gate dielectric, and a first gate spacer along sidewalls of the first gate electrode and the first gate dielectric. The NMOS device includes a second gate dielectric on the semiconductor substrate, a second gate electrode on the second gate dielectric, a nitrided polysilicon re-oxidation layer having a vertical portion and a horizontal portion wherein the vertical portion is on sidewalls of the second gate electrode and the second gate dielectric and wherein the horizontal portion is on the semiconductor substrate, and a second gate spacer on sidewalls of the second gate electrode and the second gate dielectric, wherein the second gate spacer is on the horizontal portion of the nitrided polysilicon re-oxidation layer.

18 Claims, 7 Drawing Sheets

ELECTRON MOBILITY ENHANCEMENT FOR MOS DEVICES WITH NITRIDED POLYSILICON RE-OXIDATION

TECHNICAL FIELD

This invention relates generally to semiconductor devices, and more particularly to structures and manufacturing methods of metal-oxide-semiconductor devices.

BACKGROUND

Polysilicon gates are widely used in the manufacture of metal-oxide-semiconductor (MOS) devices. In typical polysilicon (polysilicon) gate formation processes, after the formation of a gate dielectric layer and a polysilicon layer, the gate dielectric layer and the polysilicon layer are patterned to form a gate stack, which includes a gate electrode on a gate dielectric.

The patterning of the gate stack may cause damage to the gate electrode and gate dielectric, and thus, adversely affect the integrity of gate dielectric. One of the consequences is that in regions of the gate dielectric close to bottom corners of the gate electrode, a high electrical field may exist, and the adversely affected gate dielectric will cause reliability problems. In addition, the leakage current between the gate electrode and underlying substrate may increase.

To solve the above-discussed problems, a polysilicon re-oxidation process was developed. In a typical polysilicon re-oxidation process, after the patterning of the gate stack, an oxidation process is performed. Accordingly, an oxide layer is formed on the exposed sidewalls of polysilicon gate electrode and silicon substrate. With the polysilicon re-oxidation process, the integrity of gate dielectric is improved, and damage to polysilicon gate is repaired.

The conventional polysilicon re-oxidation process, however, has the adverse effects of prolonging the channel length and thickening gate dielectric, thus the performance of MOS devices is degraded. One example of such degradation is the reduction in drive currents. To compensate for the degradation in performance, a nitrided polysilicon re-oxidation process is performed, in which a silicon oxynitride layer instead of an oxide layer is formed. However, only NMOS devices benefit from the nitrided polysilicon re-oxidation, while the performance of PMOS devices is degraded.

Accordingly, what is needed in the art is a MOS device that may incorporate a silicon oxynitride layer to take advantage of the benefits associated with improved reliability and performance while at the same time overcoming the deficiencies of the prior art.

SUMMARY OF THE INVENTION

In accordance with one aspect of the present invention, a semiconductor structure includes a PMOS device and an NMOS device. The PMOS device includes a first gate dielectric on a semiconductor substrate, a first gate electrode on the first gate dielectric, and a first gate spacer along sidewalls of the first gate electrode and the first gate dielectric. The NMOS device includes a second gate dielectric on the semiconductor substrate, a second gate electrode on the second gate dielectric, a nitrided polysilicon re-oxidation layer having a vertical portion and a horizontal portion wherein the vertical portion is on sidewalls of the second gate electrode and the second gate dielectric and wherein the horizontal portion is on the semiconductor substrate, and a second gate spacer on sidewalls of the second gate electrode and the second gate dielectric, wherein the second gate spacer is on the horizontal portion of the nitrided polysilicon re-oxidation layer.

In accordance with another aspect of the present invention, an integrated circuit includes a semiconductor substrate comprising silicon, a gate dielectric on the semiconductor substrate, a gate electrode comprising silicon on the gate dielectric, a silicon oxynitride layer only substantially on sidewalls of the gate electrode and the gate dielectric, and a gate spacer on a sidewall of the silicon oxynitride layer.

In accordance with yet another aspect of the present invention, a method for forming semiconductor structure includes providing a semiconductor substrate comprising silicon, and forming a PMOS device and an NMOS device. The step of forming the PMOS device includes forming a first gate dielectric on the semiconductor substrate, forming a first gate electrode on the first gate dielectric, and forming a first gate spacer on sidewalls of the first gate electrode and the first gate dielectric. The step of forming an NMOS device includes forming a second gate dielectric on the semiconductor substrate, forming a second gate electrode on the second gate dielectric, forming a nitrided polysilicon re-oxidation layer having a vertical portion and a horizontal portion wherein the vertical portion is on sidewalls of the second gate electrode and the second gate dielectric and wherein the horizontal portion is on the semiconductor substrate, and forming a second gate spacer on sidewalls of the second gate electrode and the second gate dielectric, wherein the second gate spacer is on the horizontal portion of the nitrided polysilicon re-oxidation layer.

In accordance with yet another aspect of the present invention, a method for forming semiconductor structure includes providing a semiconductor substrate comprising a PMOS region and an NMOS region, forming a gate dielectric layer on the semiconductor substrate, forming a gate electrode layer on the gate dielectric layer, patterning the gate dielectric layer and the gate electrode layer to form a first gate stack in the PMOS region and a second gate stack in the NMOS region, performing a thermal oxidation to form an oxide layer on a sidewall of the first gate electrode, a sidewall of the second gate electrode and the semiconductor substrate, performing a nitridation to form a silicon oxynitride layer, implanting an n-type impurity to form a first LDD region in the PMOS region, implanting a p-type impurity to form a second LDD region in the NMOS region, and removing at least a horizontal portion of the silicon oxynitride layer in the PMOS region.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
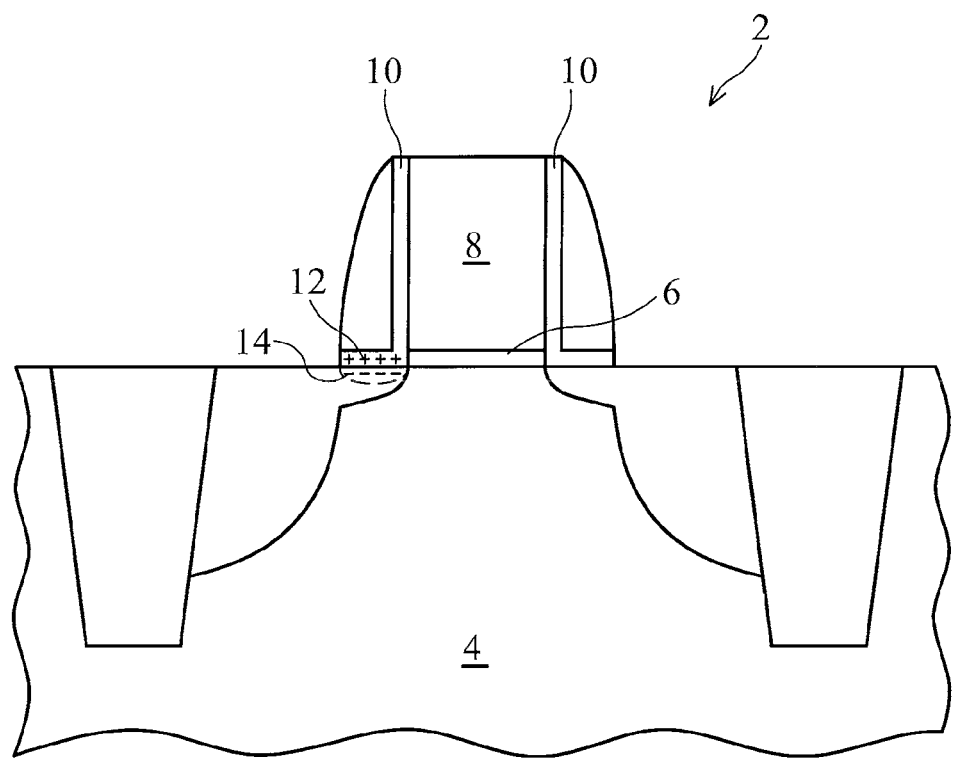
FIG. 1 illustrates a conventional MOS device having a nitrided polysilicon re-oxidation layer, in which charges are fixed.

Research has been conducted to determine the reasons why NMOS devices benefit from nitrided polysilicon re-oxidation, while PMOS devices are degraded. One possible reason may be explained using FIG. 1, which shows a MOS device 2 formed on a silicon substrate 4. MOS device 2 includes a gate oxide 6 and a polysilicon gate 8. A silicon oxynitride layer 10 is formed on a sidewall of polysilicon gate 8. Silicon oxynitride layer 10 further includes a horizontal portion 12 on substrate 2. During the operation of MOS device 2, the horizontal portion 12 will fix positive charges, which causes an inversion layer 14 formed in substrate 4 and underneath horizontal portion 12. Inversion layer 14 includes negative charges. Since channel regions of NMOS devices have negative charges, the formation of inversion layer 14 helps the formation of inversion layers in channel regions. As a result, the performance of NMOS devices is improved. Conversely, inversion layers of PMOS devices include positive charges, and thus the negatively charged inversion layer 14 is detrimental to the formation of inversion layers of PMOS devices. PMOS devices are therefore degraded.

Based on the findings discussed in the preceding paragraphs, the preferred embodiments of the present invention are provided. The intermediate stages of manufacturing a preferred embodiment of the present invention, which combines the formation of PMOS and NMOS devices, are illustrated. Throughout the various views and illustrative embodiments of the present invention, like reference numbers are used to designate like elements.

Figure 2:
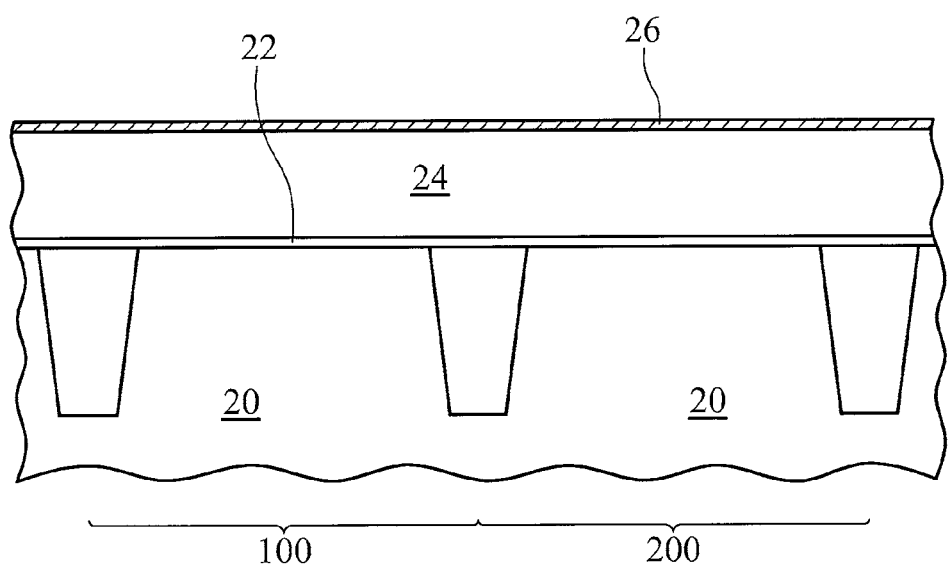
FIGS. 2 through 9 are cross-sectional views of intermediate stages in the manufacture of a MOS device.

FIG. 2 illustrates a substrate 20, which includes an active region 100 for forming a PMOS device and an active region 200 for forming an NMOS device. Substrate 20 preferably comprises bulk silicon, although other commonly used structures and materials such as silicon-on-insulator (SOI) and silicon alloys can be used. Substrate 20 is preferably lightly doped.

Gate dielectric layer 22 is formed on the substrate 20. In one embodiment, gate dielectric layer 22 comprises silicon oxide. In other embodiments, gate dielectric layer 22 comprises dielectric materials having a high dielectric constant (k value), for example, greater than about 3.9. The preferred materials include silicon nitrides, oxynitrides, dielectric metal oxides such as $HfO_2$, $HfZrO_x$, $HfSiO_x$, $HfTiO_x$, $HfAlO_x$, and the like, combinations thereof, and multi-layers thereof.

Gate electrode layer 24 is formed on gate dielectric layer 22. Gate electrode layer 24 preferably comprises polysilicon, and is preferably formed using commonly used methods such as polycide. A hard mask layer 26, which preferably comprises silicon nitride, may be formed on gate electrode layer 24. The preferred methods for forming gate dielectric layer 22, gate electrode layer 24 and mask layer 26 include chemical vapor deposition (CVD) techniques such as low temperature CVD (LTCVD), low pressure CVD (LPCVD), rapid thermal CVD (RTCVD), plasma enhanced CVD (PECVD), and other commonly used methods.

Figure 3:
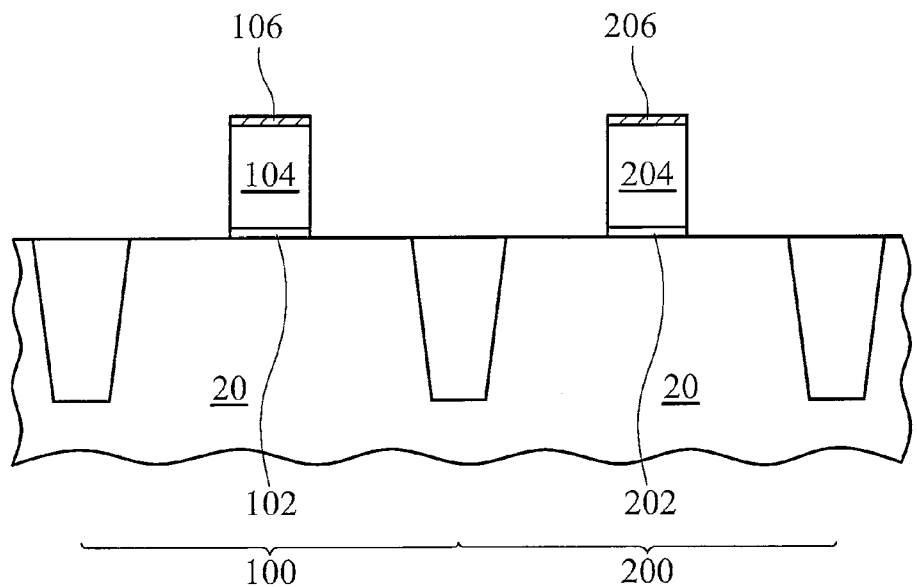

FIG. 3 illustrates the formation of gate stacks, wherein gate dielectric layer 22, gate electrode layer 24 and hard mask layer 26 are patterned to form gate stacks in regions 100 and 200. The patterned hard mask layer 26, gate electrode layer 24 and gate dielectric layer 22 form hard masks 106 and 206, gate electrodes 104 and 204 and gate dielectrics 102 and 202, in regions 100 and 200, respectively.

Figure 4:
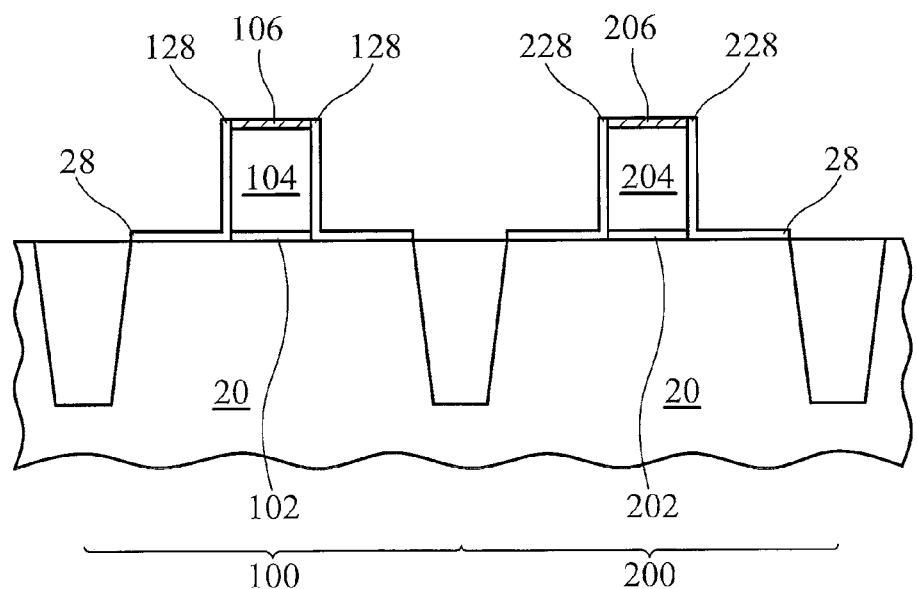

FIG. 4 illustrates the formation of nitrided polysilicon re-oxidation layer 28 on the surface of substrate 20 and sidewalls of the gate stacks. Nitrided polysilicon re-oxidation layer 28 includes a first portion 128 in PMOS region 100 and a second portion 228 in NMOS region 200. The thickness of nitrided polysilicon re-oxidation layer 28 is preferably between about 10 Å and about 40 Å, and more preferably between about 15 Å and about 25 Å.

In a first embodiment, nitrided polysilicon re-oxidation layer 28 is formed by performing an oxidation step to form an oxide layer on the surface of substrate 20 and sidewalls of the gate stacks, and then nitridating the oxide layer to form nitrided polysilicon re-oxidation layer 28. The oxide layer may be formed by a rapid thermal oxidation (RTO), a furnace dry oxide anneal, or other commonly used oxidation methods. Preferably, the oxide layer is formed at an elevated temperature, for example, between about 400° C. and about 1100° C. in an environment comprising oxygen-containing gases. The preferred oxygen-containing gases may include $O_2$, NO, $N_2O$, $NO_2$, $O_3$, $H_2O$, a combined gas of $H_2$ and $O_2$, and combinations thereof.

A nitridation is then performed to the oxide layer to convert the oxide layer to nitrided polysilicon re-oxidation layer 28. In the preferred embodiment, plasma nitridation is performed, wherein the process gases may include nitrogen-containing gases, such as $NH_3$, NO-based gases such as NO, $N_2O$, $NO_2$, and combinations thereof The plasma may be generated locally in the same environment where the nitridation occurs. Alternatively, the plasma is generated remotely (using remote plasma generation) in a different environment from where the nitridation occurs. In other embodiments, thermal nitridation is performed, wherein a wafer containing the structure shown in FIG. 4 is heated in a nitrogen-containing environment. In yet other embodiments, the nitridation is performed by implanting nitrogen into the oxide layer, wherein the implanted species may include $N_2$, NO, $N_2O$, $NO_2$, $NH_3$, $N_2H_4$, $N_2O_4$, and combinations thereof. The implantation may be vertical or slant. Throughout the description, polysilicon re-oxidation layer 28 is alternatively referred to as silicon oxynitride layer 28. Accordingly, the portions 128 and 228 of silicon oxynitride layer 28 are referred to as silicon oxynitride layers 128 and 228, respectively. Nitrided polysilicon re-oxidation layer 28 is a dense, high quality dielectric layer.

In a second embodiment, the re-oxidation and nitridation are performed simultaneously. Preferably, the process gases include both oxygen and nitrogen containing gases, such as oxygen, NO, $N_2O$, $NO_2$, $NH_3$, NO-based gases such as NO, $N_2O$, $NO_2$, and combinations thereof. Similarly, the simultaneous re-oxidation and nitridation may be performed with the assistance of plasma or under thermal conditions.

Figure 5:
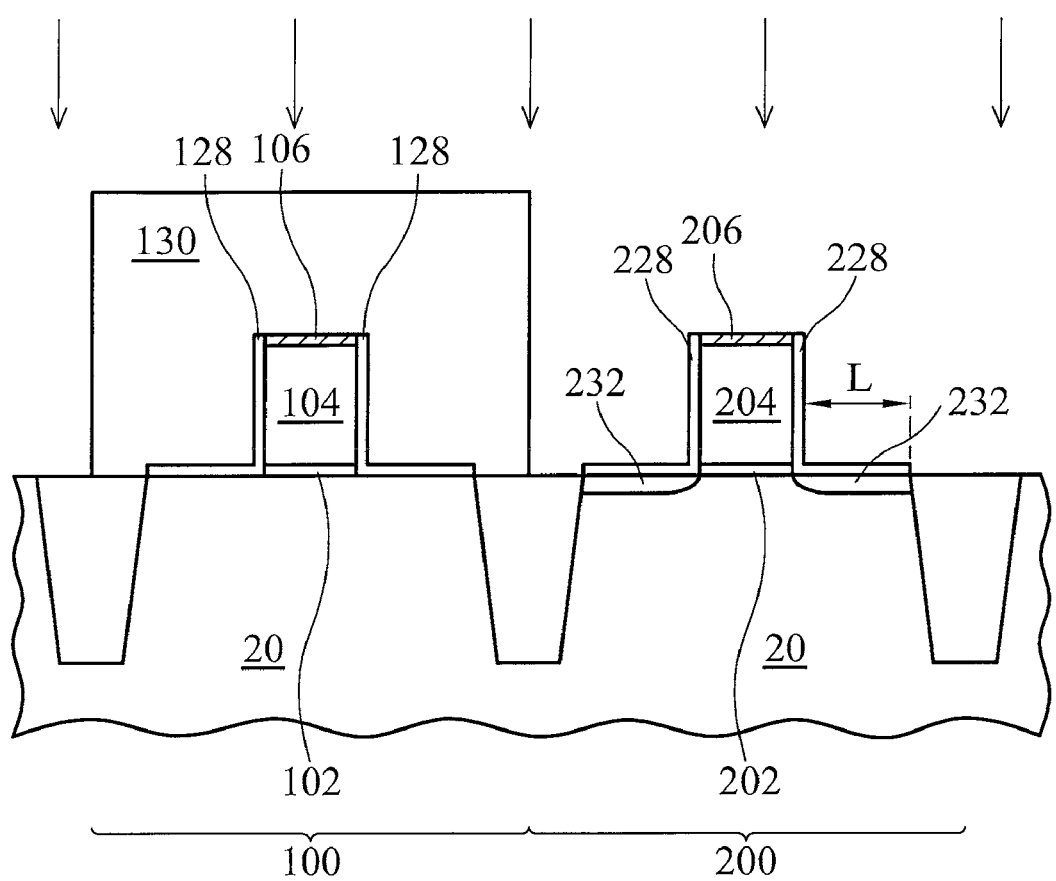

Referring to FIG. 5, photo resist 130 is formed and patterned to mask PMOS region 100. Lightly-doped drain/source (LDD) regions 232 and pocket regions (not shown) are then formed. As is known in the art, to form LDD regions 232, an implantation is performed to introduce n-type impurities into substrate 20 to form LDD regions 232. The implanted impurities penetrate nitrided re-oxidation layer 228 into substrate 20. Pocket regions are also formed by implanting p-type impurities. Photo resist 130 is then removed.

Figure 6:
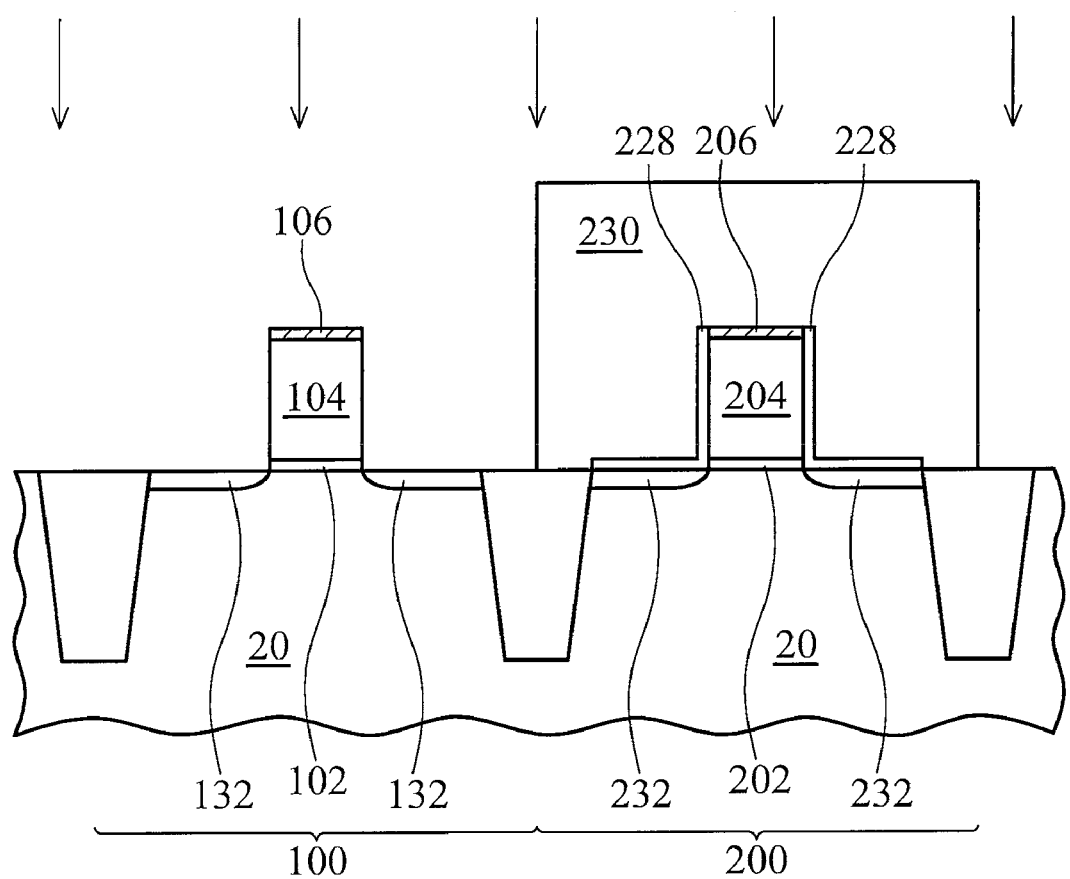

Referring to FIG. 6, photo resist 230 is formed and patterned to mask NMOS region 200. Lightly-doped drain/source (LDD) regions 132 and pocket regions (not shown) are then formed. Preferably, an implantation is performed to introduce p-type impurities into substrate 20. The implanted impurities penetrate silicon oxynitride layer 128 into substrate 20 to form LDD regions 132. Pocket regions (not shown) are also formed by implanting n-type impurities.

After the formation of LDD regions 132 and the pocket regions, nitrided re-oxidation layer 128 is removed. In the preferred embodiment, the removal of silicon oxynitride layer 128 is performed using photo resist 230 as a mask, and thus both vertical and horizontal portions of silicon oxynitride layer 128 are removed. Due to process variations, a thin vertical portion of silicon oxynitride layer 128, which may have a thickness of less than about 4 Å, may remain after the removal process. In other embodiments, only horizontal portions of silicon oxynitride layer 128 are removed, although an additional photo resist may be needed in order to protect vertical portions of silicon oxynitride layer 128. Due to process variations, small portions of the horizontal portions of silicon oxynitride layer 128 may be left. Preferably, the horizontal portions is as small as possible, for example, with a length of less than about 10% percent of the length L of the respective horizontal portions. In an exemplary embodiment, the removal of nitrided re-oxidation layer 128 is performed using dry etch. By removing horizontal portions of silicon oxynitride layer 128 in PMOS region 100, no charge will be fixed, and thus the degradation to PMOS devices is eliminated. After the removal of silicon oxynitride layer 128, photo resist 230 is removed.

Figure 7:
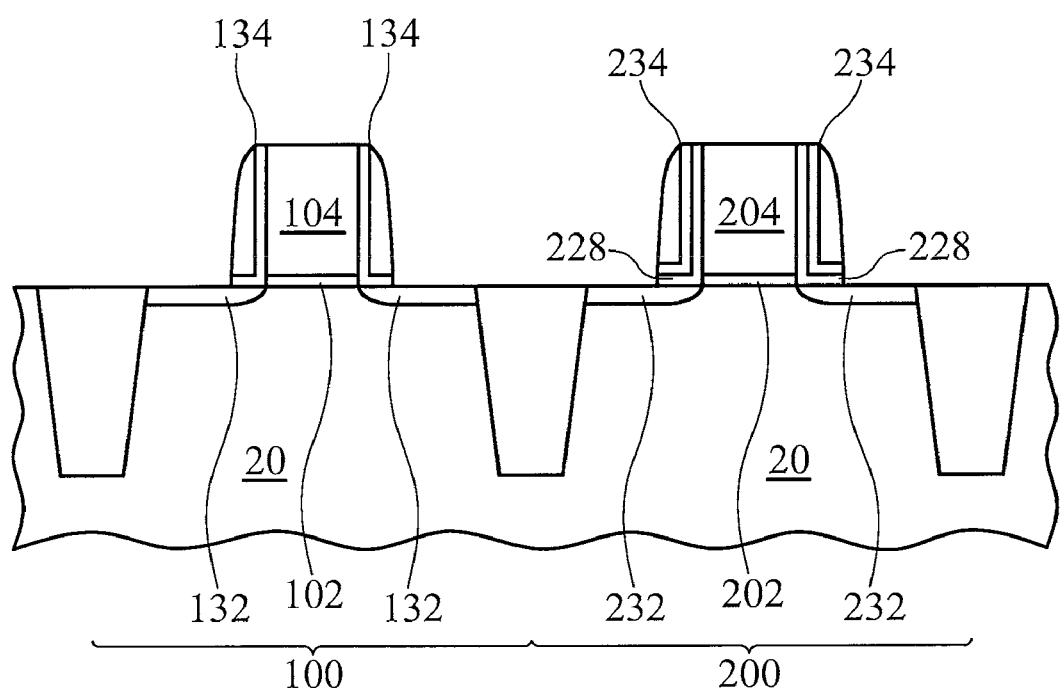

Gate spacers 134 and 234 are then preferably formed, as is shown in FIG. 7. As is known in the art, gate spacers 134 and 234 may be formed by depositing one or more spacer layers (not shown), and removing horizontal portions of the spacer layers by etching. In the preferred embodiment, the spacer layers include a nitride layer on a liner oxide layer. The preferred spacer deposition methods include PECVD, LPCVD, sub-atmospheric CVD (SACVD), and the like. Hard masks 106 and 206 are also removed when the spacer layers is etched, preferably using phosphorous acid.

Figure 8:
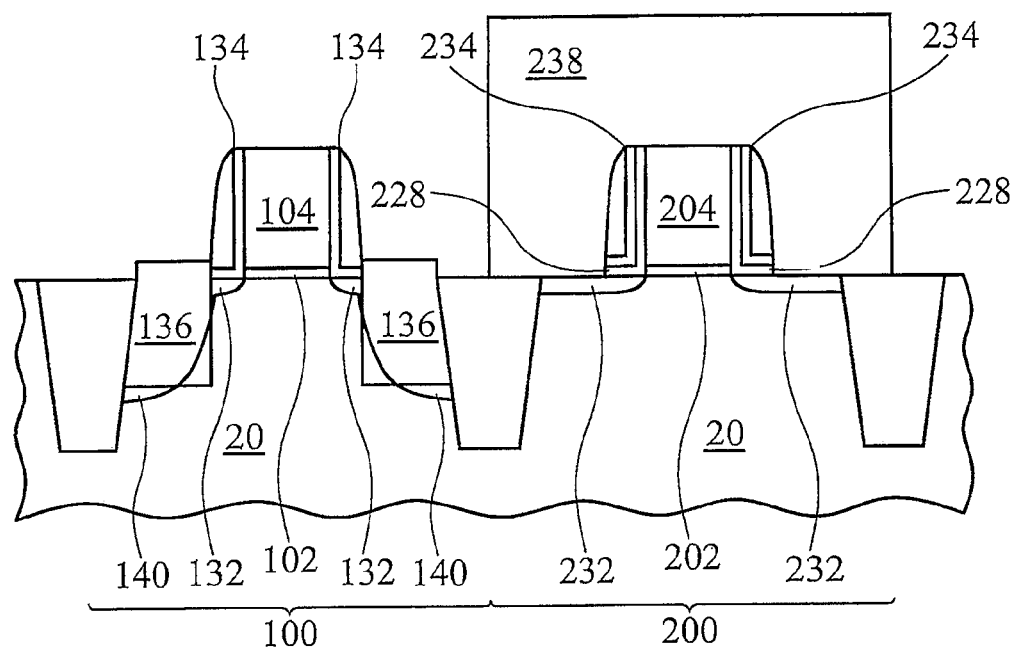

FIG. 8 illustrates the formation of silicon germanium (SiGe) stressors 136. Preferably, a photo resist 238 is formed covering NMOS region 200. Recesses are formed in substrate 20 and aligned with the outer edges of spacers 134, preferably by etching isotropically or anisotropically. SiGe stressors 136 are then formed in the recesses. In the preferred embodiment, SiGe stressors 136 are epitaxially grown. After being annealed, SiGe stressors 136 will try to restore their lattice spacing, which is greater than the lattice spacing of substrate 20. This introduces a compressive stress in the respective channel region of the resulting PMOS device, and thus the drive current of the PMOS device is increased. Photo resist 238 is then removed. In the preferred embodiment, SiGe stressors 136 are doped with a p-type impurity during the epitaxial growth, thus forming the source/drain regions of the respective PMOS devices. Further implantation can be performed to form deep source/drain regions 140. The resulting deep source/drain regions 140 are substantially aligned with edges of the spacers 134. Alternatively, no p-type impurity is doped when SiGe stressors 136 are epitaxially grown, and deep source/drain regions are formed only by the implantation.

Figure 9:
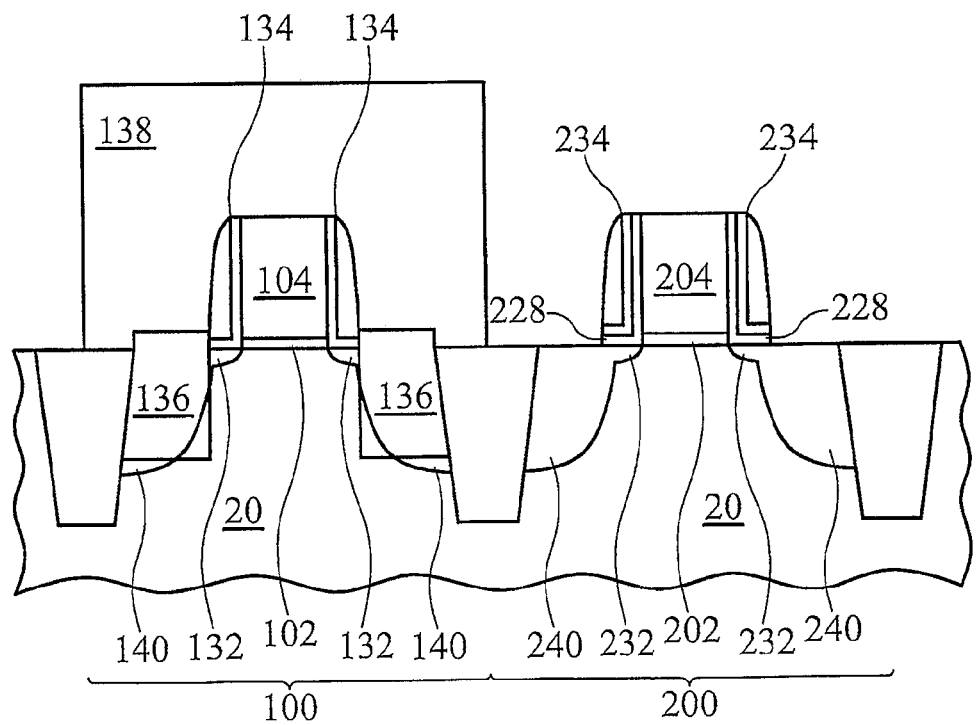

FIG. 9 illustrates the formation of deep source/drain regions 240, wherein n-type impurities, such as phosphorus or arsenic, are implanted. During the implantation, PMOS region 100 is masked by a photo resist 138.

The embodiments of the present invention have several advantageous features. The damage to MOS devices caused by gate patterning may be recovered due to the polysilicon re-oxidation and nitridation processes, and leakage currents are reduced. Electron mobility and drive currents for NMOS devices are improved, while with the removal of nitrided polysilicon re-oxidation layer from PMOS devices, the degradation to PMOS devices is eliminated. Additional advantageous features of the present invention include reduced leakage current flowing between gate and source/drain regions, and improved reliability due to improved resistance to hot electron injections.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming semiconductor structure comprising:
   providing a semiconductor substrate comprising silicon;
   forming a PMOS device comprising:
      forming a first gate dielectric on the semiconductor substrate;
      forming a first gate electrode on the first gate dielectric; and
      forming a first gate spacer on sidewalls of the first gate electrode and the first gate dielectric, wherein the PMOS device is free from a nitrided polysilicon re-oxidation material between the first gate spacer and a respective sidewall of the first gate electrode; and
   forming an NMOS device comprising:
      forming a second gate dielectric on the semiconductor substrate;
      forming a second gate electrode on the second gate dielectric;
      forming a nitrided polysilicon re-oxidation layer having a vertical portion and a horizontal portion, wherein the vertical portion is on sidewalls of the second gate electrode and the second gate dielectric, and wherein the horizontal portion is on the semiconductor substrate; and
      forming a second gate spacer on sidewalls of the second gate electrode and the second gate dielectric, wherein the second gate spacer is on the horizontal portion of the nitrided polysilicon re-oxidation layer.

2. The method of claim 1, wherein the step of forming the nitrided polysilicon re-oxidation layer comprises:
   performing a thermal oxidation to form an oxide layer on the sidewall of the second gate electrode and on the semiconductor substrate; and
   performing a nitridation to convert the oxide layer to the nitrided polysilicon re-oxidation layer.

3. The method of claim 2, wherein the step of performing the nitridation comprises plasma nitridation.

4. The method of claim 3, wherein the step of plasma generation comprises locally generating plasma.

5. The method of claim 3, wherein the step of plasma generation comprises remotely generating plasma.

6. The method of claim 2, wherein the step of performing the nitridation comprises thermal nitridation.

7. The method of claim 2, wherein the step of performing the nitridation comprises implanting nitrogen into the oxide layer.

8. The method of claim 1, wherein the step of forming the nitrided polysilicon re-oxidation layer comprises simultaneously oxidizing and nitridating a sidewall portion of the second gate electrode and a top portion of the semiconductor substrate in an environment containing both oxygen and nitrogen.

9. The method of claim 8, wherein the step of simultaneous oxidizing and nitridating is assisted by plasma.

10. The method of claim 1, wherein the step of forming the nitrided polysilicon re-oxidation layer comprises forming the nitrided polysilicon re-oxidation layer for both the PMOS device and the NMOS device, and removing portions from the PMOS device.

11. A method for forming semiconductor structure, the method comprising:
    providing a semiconductor substrate comprising a PMOS region and an NMOS region;
    forming a gate dielectric layer on the semiconductor substrate;
    forming a gate electrode layer on the gate dielectric layer;
    patterning the gate dielectric layer and the gate electrode layer to form a first gate stack in the PMOS region and a second gate stack in the NMOS region;
    performing a thermal oxidation to form an oxide layer on a sidewall of the first gate stack, a sidewall of the second gate stack and the semiconductor substrate;
    performing a nitridation to form a silicon oxynitride layer comprising a first portion on the sidewall of the first gate stack, and a second portion on the sidewall of the second gate stack;
    implanting an n-type impurity to form a first LDD region in the NMOS region;
    implanting a p-type impurity to form a second LDD region in the PMOS region; and
    removing the first portion of the silicon oxynitride layer, with the second portion of the silicon oxynitride layer not removed.

12. The method of claim 11, wherein the step of removing the first portion of the silicon oxynitride layer in the PMOS region is performed after the step of implanting the p-type impurity.

13. The method of claim 11, wherein the step of removing the first portion of the silicon oxynitride layer in the PMOS region is performed using a same mask as the step of implanting the p-type impurity.

14. The method of claim 11, wherein the step of removing the first portion of the silicon oxynitride layer in the PMOS region is performed using a different mask as the step of implanting the p-type impurity.

15. The method of claim 11 further comprising forming a first gate spacer on the sidewall of the first gate stack, and simultaneously forming a second gate spacer on a horizontal portion of the silicon oxynitride layer in the NMOS region.

16. The method of claim 15, wherein the steps of forming the first and second gate spacers comprise blanket forming a gate spacer layer, and patterning the gate spacer layer and the silicon oxynitride layer.

17. The method of claim 11, wherein the step of performing the nitridation is after the step of performing the thermal oxidation.

18. The method of claim 11, wherein the step of the thermal oxidation and the step of the nitridation are simultaneously performed in an environment comprising both oxygen and nitrogen.

* * * * *